United States Patent
Shank et al.

(10) Patent No.: US 11,569,405 B2
(45) Date of Patent: Jan. 31, 2023

(54) PHOTODETECTORS WITH A LATERAL COMPOSITION GRADIENT

(71) Applicant: GLOBALFOUNDRIES U.S. Inc., Santa Clara, CA (US)

(72) Inventors: Steven M. Shank, Jericho, VT (US); Vibhor Jain, Essex Junction, VT (US); Anthony K. Stamper, Williston, VT (US); John J. Ellis-Monaghan, Grand Isle, VT (US); John J. Pekarik, Underhill, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 663 days.

(21) Appl. No.: 16/686,973

(22) Filed: Nov. 18, 2019

(65) Prior Publication Data

US 2021/0151621 A1    May 20, 2021

(51) Int. Cl.
*H01L 31/103* (2006.01)
*H01L 31/18* (2006.01)
*H01L 31/028* (2006.01)

(52) U.S. Cl.
CPC .......... *H01L 31/103* (2013.01); *H01L 31/028* (2013.01); *H01L 31/1812* (2013.01)

(58) Field of Classification Search
CPC .. H01L 31/103; H01L 31/028; H01L 31/1812
See application file for complete search history.

(56) References Cited

U.S. PATENT DOCUMENTS

2012/0025212 A1    2/2012   Kouvetakis et al.
2020/0144443 A1*   5/2020   El Zammar ......... H01L 31/1896

OTHER PUBLICATIONS

C.-K. Tseng, C.-H. Chiu, S.-C. Yen, K.-C. Hsieh, N. Na and M.-C. Lee, "GeSn waveguide photodetectors fabricated by rapid-melt-growth method," 2015 International Symposium on Next-Generation Electronics (ISNE), 2015, pp. 1-4, doi: 10.1109/ISNE.2015.7132044. (Year: 2015).*

Anthony K. Stamper et al., "Photodiodes Integrated Into a Bicmos Process" filed Aug. 19, 2019 as U.S. Appl. No. 16/544,074.

Liu et al., "Defect-free high Sn-content GeSn on insulator grown by rapid melting growth", Scientific Reports vol. 6, Article No. 38386 (2016).

(Continued)

*Primary Examiner* — Matthew L Reames
(74) *Attorney, Agent, or Firm* — Thompson Hine LLP; Anthony Canale

(57) ABSTRACT

Structures including a photodetector and methods of fabricating such structures. The photodetector is positioned over the top surface of the substrate. The photodetector includes a portion of a semiconductor layer comprised of a semiconductor alloy, a p-type doped region in the portion of the semiconductor layer, and an n-type doped region in the portion of the semiconductor layer. The p-type doped region and the n-type doped region converge along a p-n junction. The portion of the semiconductor layer has a first side and a second side opposite from the first side. The semiconductor alloy has a composition that is laterally graded from the first side to the second side of the portion of the semiconductor layer.

20 Claims, 4 Drawing Sheets

(56) References Cited

OTHER PUBLICATIONS

Dou et al., "Crystalline GeSn growth by plasma enhanced chemical vapor deposition", Optical Materials Express vol. 8, Issue 10, pp. 3220-3229 (2018).
P. Zaumseil et al., "The thermal stability of epitaxial GeSn layers" APL Materials 6, 076108 (2018).
M. Oehme et al., "GeSn p-i-n detectors integrated on Si with up to 4% Sn", Appl. Phys. Lett. 101, 141110 (2012).
Tseng et al., "GeSn Waveguide Photodetectors Fabricated by Rapid-Melt-Growth Method", 2015 International Symposium on Next-Generation Electronics (ISNE), Taipei, 2015, pp. 1-4.

\* cited by examiner

PHOTODETECTORS WITH A LATERAL COMPOSITION GRADIENT

BACKGROUND

The present invention relates to photonics chips and, more particularly, to structures including a photodetector and methods of fabricating such structures.

Light Detection and Ranging (LIDAR) is a laser-mapping technology that measures distance to a target by illuminating the target with pulsed laser light and measuring pulses reflected from the target with a sensor. LIDAR is used in, for example, autonomous robots and self-driving cars. The sensor employed in a LIDAR system, and also in other infrared wavelength motion detection systems, is a germanium photodetector. Germanium is characterized by high absorption in the infrared wavelength range.

Typically, a LIDAR system is implemented by a two-chip construction in which one chip includes one or more germanium photodetectors and a second chip includes a trans-impedance amplifier as well as associated logic and input/output. Each germanium photodetector converts incident reflected pulses received from the target into current as photons of electromagnetic radiation are absorbed in the germanium. The trans-impedance amplifier amplifies the current generated by the photodetector and converts the current into a voltage.

In certain applications such as vehicles operating at normal highway speeds, the laser of a LIDAR system may require a higher power to improve the signal-to-noise ratio. The power increase may require laser operation at longer wavelengths, such as a wavelength of about 1.5 microns. Photodetectors must be capable of operating at such longer wavelengths to promote the improvement in the signal-to-noise ratio.

Improved structures including a photodetector and methods of fabricating such structures are needed.

SUMMARY

In an embodiment of the invention, a structure includes a substrate having a top surface and a photodetector positioned over the top surface of the substrate. The photodetector includes a portion of a semiconductor layer comprised of a semiconductor alloy, a p-type doped region in the portion of the semiconductor layer, and an n-type doped region in the portion of the semiconductor layer. The p-type doped region and the n-type doped region converge along a p-n junction, the portion of the semiconductor layer has a first side and a second side opposite from the first side, and the semiconductor alloy has a composition that is laterally graded from the first side to the second side.

In an embodiment of the invention, a method includes forming a semiconductor layer over a substrate, forming a p-type doped region in a portion of the semiconductor layer, and forming an n-type doped region in the portion of the semiconductor layer. The portion of the semiconductor layer is comprised of a semiconductor alloy. The p-type doped region and the n-type doped region converge along a p-n junction. The portion of the semiconductor layer has a first side and a second side opposite from the first side. The semiconductor alloy has a composition that is laterally graded from the first side to the second side.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 6 is a diagrammatic top view of the structure of FIG. 5 that is simplified for clarity of illustration and in which FIG. 5 is taken generally along line 5-5.

DETAILED DESCRIPTION

Figure 1:
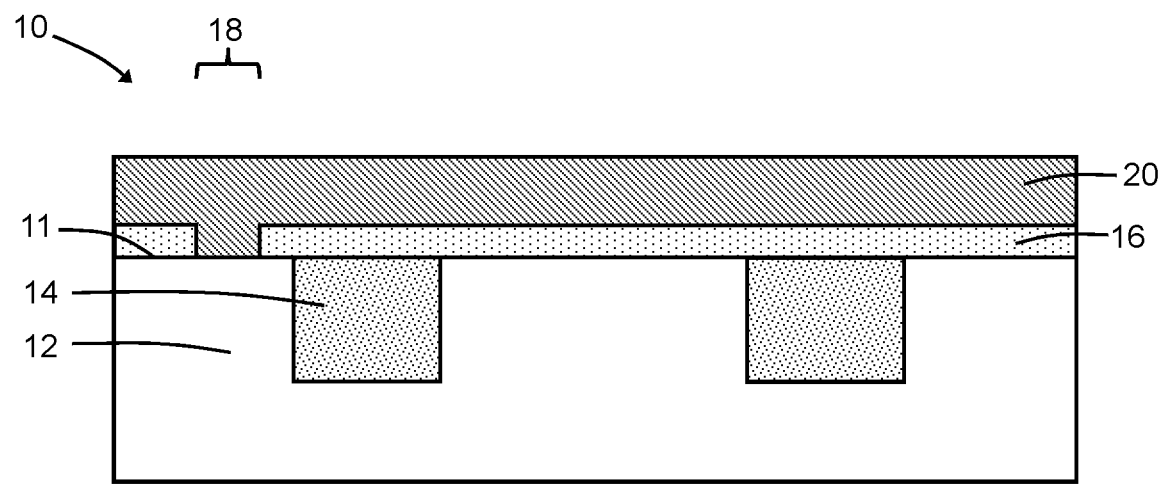
FIG. 1 is a cross-sectional view of a structure at an initial fabrication stage of a processing method in accordance with embodiments of the invention.

With reference to FIG. 1 and in accordance with embodiments of the invention, a structure 10 includes a substrate 12 and shallow trench isolation regions 14 located in the substrate 12. A region of the substrate 12 may be used to fabricate a photodetector. An additional region (not shown) of the substrate 12 may be used to fabricate transistors as part of a CMOS process or a BiCMOS process. The substrate 12 may be, for example, a bulk substrate composed of a single-crystal semiconductor material, such as a bulk single-crystal silicon substrate.

A dielectric layer 16 is deposited over a top surface 11 of the substrate 12 and is patterned by lithography and etching processes to define an opening 18. The opening 18, which penetrates fully through the dielectric layer 16 to the substrate 12, exposes an area on the top surface 11 of the substrate 12 that operates as a seed during a subsequent recrystallization process. The opening 18 in the dielectric layer 16 is located outside of the area surrounded by the shallow trench isolation regions 14. The dielectric layer 16 may be composed of a dielectric material, such as silicon nitride. In an alternative embodiment, the portion of the substrate 12 providing the recrystallization seed may include a germanium layer that is added either before the dielectric layer 16 is deposited or after the dielectric layer 16 is patterned.

The shallow trench isolation regions 14 may be formed in the substrate 12 by etching trenches to a given depth into the substrate 12, depositing a dielectric material, such as silicon dioxide, in the trenches, and planarization with chemical-mechanical polishing. The shallow trench isolation regions 14 are shaped and arranged such that the opening 18 in the dielectric layer 16 exposes the portion of the substrate 12 and does not interfere with the function of the portion of the substrate 12 as a recrystallization seed.

A semiconductor layer 20 is on the dielectric layer 16 and over the top surface 11 of the substrate 12. A portion of the semiconductor layer 20 is located in the opening 18 in the dielectric layer 16 and, consequently, the portion of the semiconductor layer 20 is in direct contact with the portion of the substrate 12 exposed by the opening 18. The semiconductor layer 20 may be composed of a semiconductor alloy. In an embodiment, the semiconductor layer 20 may be composed of a germanium-tin alloy deposited by plasma-enhanced chemical vapor deposition or rapid-thermal chemical vapor deposition. The dielectric layer 16 prevents direct contact between the semiconductor layer 20 and the substrate 12 with an exception of the direct contact between the semiconductor layer 20 and the substrate 12 occurs inside the opening 18. The material contained in the semiconductor layer 20, as deposited, is not single-crystal. Instead, the material contained in the semiconductor layer 20, as deposited, may be in an amorphous state that lacks long-range order or in a polycrystalline state that includes crystalline grains and grain boundaries.

Figure 2:
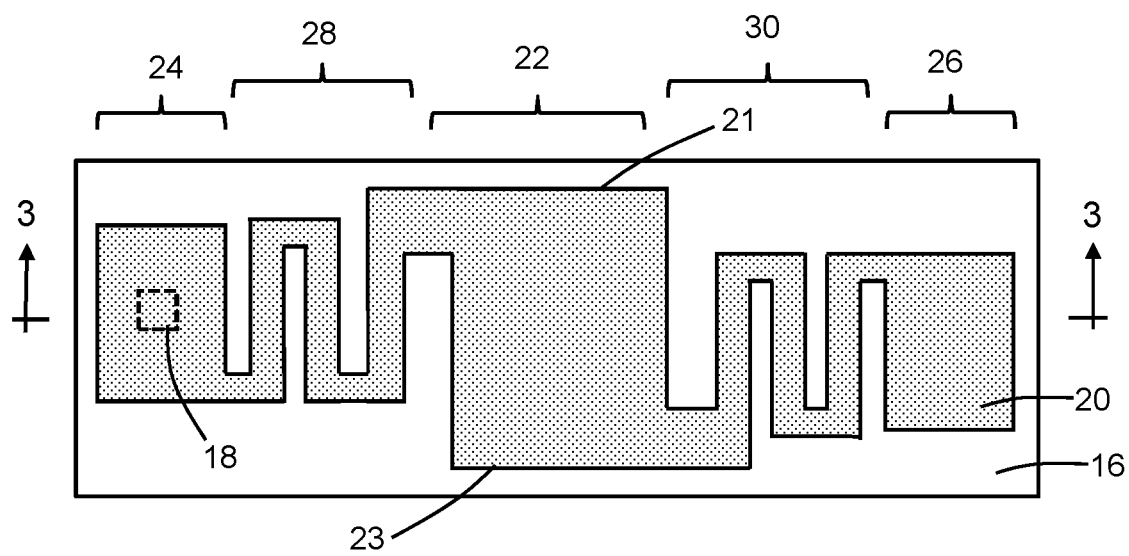
FIG. 2 is a top view of the structure at a fabrication stage subsequent to FIG. 1.
Figure 3:
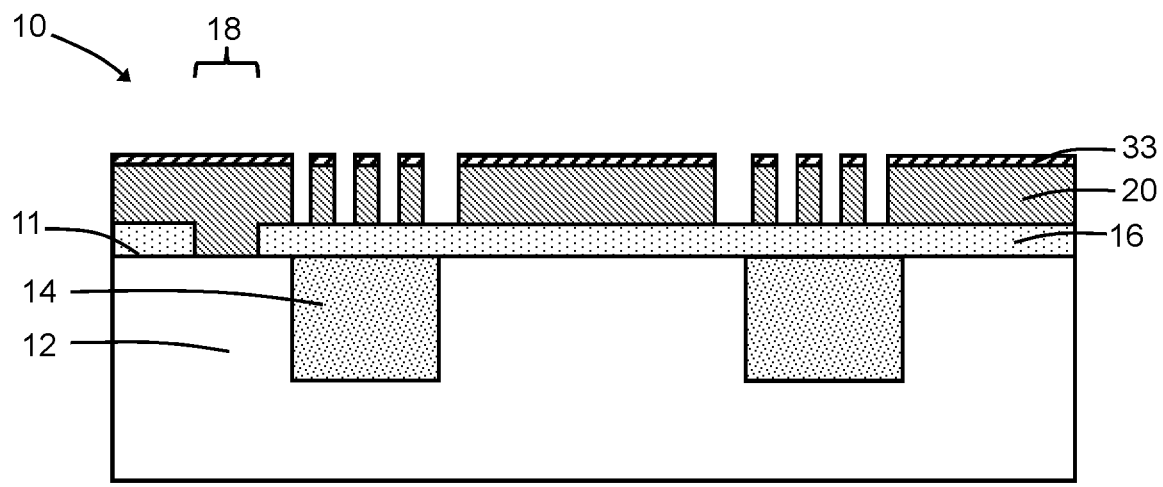
FIG. 3 is a cross-sectional view taken generally along line 3-3 in FIG. 2.

With reference to FIGS. 2, 3 in which like reference numerals refer to like features in FIG. 1 and at a subsequent fabrication stage, a hardmask 33, which may be composed of silicon nitride, is formed over the semiconductor layer 20. The semiconductor layer 20 is patterned by an etching process, such as a reactive ion etching process, with the hardmask 22 covering and protecting masked portions of the semiconductor layer 20.

The patterned semiconductor layer 20 includes a detection or active region 22, pad regions 24, 26, and serpentine regions 28, 30 that wind back and forth with changes in direction characteristic of a serpentine layout. The pad region 24 includes the portion of the semiconductor layer 20 that has the contacting relationship with the portion of the substrate 12 exposed by the opening 18 in the dielectric layer 16. The serpentine region 28 couples the pad region 24 to the active region 22, and the pad region 26 is coupled to the active region 22 by the serpentine region 30. The active region 22 is laterally positioned between the pad region 24 and the pad region 26. The semiconductor layer 20 may have a uniform or substantially uniform thickness in the different regions 22, 24, 26, 28, 30. The dielectric layer 16 is exposed over areas from which the semiconductor layer 20 is removed during patterning. The active region 22 includes a side 21 at which the serpentine region 28 is connected to the active region 22 and an opposite side 23 at which the serpentine region 30 is connected to the active region 22.

Figure 4:
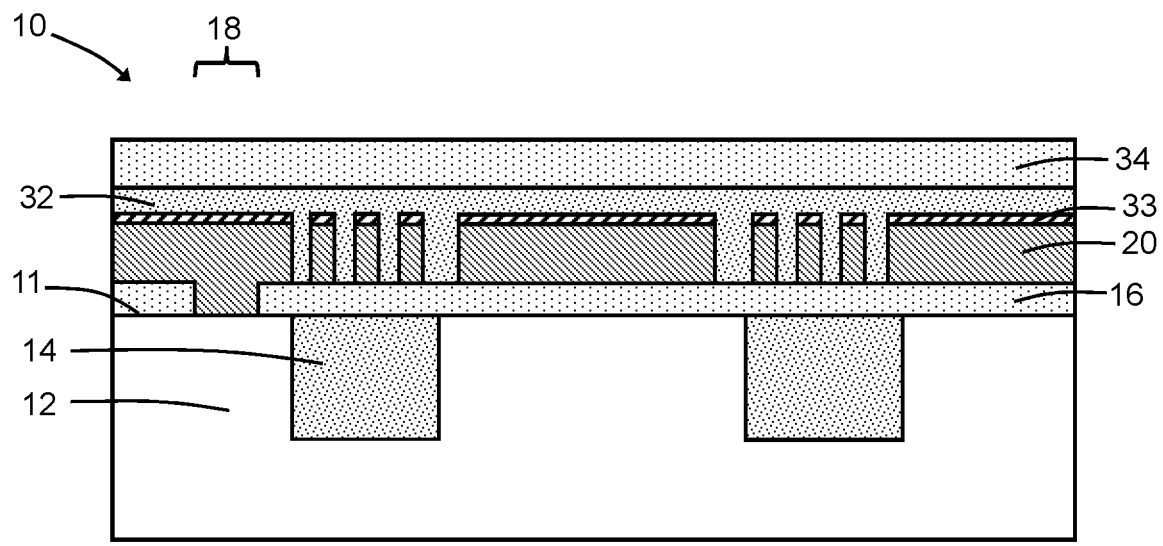
FIGS. 4-5 are cross-sectional views of the structure at successive fabrication stages subsequent to FIG. 3.

With reference to FIG. 4 in which like reference numerals refer to like features in FIG. 3 and at a subsequent fabrication stage, dielectric layers 32, 34 are formed as dual-layer encapsulation over the dielectric layer 16 and the patterned semiconductor layer 20. The dielectric layer 32 may be composed of silicon nitride deposited by chemical vapor deposition and planarized, and the dielectric layer 34 may be composed of silicon dioxide. Portions of the dielectric layer 32 fill the spaces in the areas surrounding and between the regions 22, 24, 26, 28, 30 of the patterned semiconductor layer 20. The sections of the hardmask 33 are positioned over the regions 22, 24, 26, 28, 30 of the patterned semiconductor layer 20 and between the patterned semiconductor layer 20 and the dielectric layer 32.

A thermal treatment, such rapid thermal annealing, is used to melt and liquefy the semiconductor layer 20, which subsequently recrystallizes upon cooling by rapid melt growth. The thermal treatment may elevate the temperature of the semiconductor layer 20 beyond its melting point such that the material of the semiconductor layer 20 melts and enters a liquid state. For example, the melting point of a germanium-tin alloy is about 930° C. The dielectric layers 16, 32, 34 and the substrate 12 have respective melting points that are greater than the melting point of the semiconductor layer 20 so that the liquefied material of the melted semiconductor layer 20 remains confined.

The material of the semiconductor layer 20 recrystallizes as the molten material cools and solidifies following the conclusion of the thermal treatment that ends the heating. During solidification, the portion of the substrate 12 exposed by the opening 18 in the dielectric layer 16 provides a single-crystal seed for recrystallization at an interface between the molten material of the semiconductor layer 20 in the pad region 24 and the single-crystal seed. Solidification and recrystallization of the molten material occurs at a melt growth front that is initiated at the single-crystal seed and advances along a melt path length in a direction from the pad region 24 to the pad region 26. The semiconductor layer 20 solidifies into single-crystal semiconductor material as the melt growth front progressively advances from the pad region 24 toward the pad region 26. To reach the active region 22, the melt growth front advances from the pad region 24 through the serpentine region 28. The melt growth front then advances along a portion of the melt path length across the active region 22 in a direction from the side 21 at which the serpentine region 28 is connected to the active region 22 to the opposite side 23 at which the serpentine region 30 is connected to the active region 22. The melt growth front then advances through the serpentine region 30 to the pad region 26.

The recrystallization process alters the relative composition of the recrystallized semiconductor material along the length of the patterned semiconductor layer 20 such that the alloy composition is laterally graded along the melt path length and the length of the patterned semiconductor layer 20. As the melt growth front proceeds along the melt path length, atoms of an alloy component (e.g., tin) may be pushed by a snowplow effect in the molten material of the semiconductor layer 20. This preferential segregation of an alloy component depletes the solidified material of the semiconductor layer 20 of the alloy component (e.g., tin) behind the advancing melt growth front and enriches the molten material of the semiconductor layer 20 in the alloy component (e.g., tin) at the advancing melt growth front. For example, the atomic concentration of the alloy component (e.g., tin) in the pad region 24 of the recrystallized semiconductor layer 20 may be less than the atomic concentration of the alloy component (e.g., tin) of the recrystallized semiconductor layer 20 in the active region 22. Thus, following thermal treatment and cooling, the recrystallized semiconductor layer 20 may have an atomic ratio of one alloy component (e.g., tin) to another alloy component (e.g., germanium) that varies along the length of the semiconductor layer 20. For a germanium-tin alloy, the atomic concentration of tin atoms is lowest near the single-crystal seed in the pad region 24 and is highest in the pad region 26 such that the atomic ratio of tin to germanium is an increasing function of position along the melt path length and length of the semiconductor layer 20 with increasing distance from the single-crystal seed.

The ratio of alloy components in the active region 22 may be selected by selection of the portions of the total melt path length defined by the physical lengths of the serpentine region 28 and the serpentine region 30. For example, the ratio of germanium-to-tin in the active region 22 of the recrystallized semiconductor layer 20 may be selected by selection of the portions of the total melt path length defined by the physical lengths of the serpentine region 28 and serpentine region 30. The ratio of alloy components will vary across the active region 22 of the recrystallized semiconductor layer 20 from the side 21 to the side 23 (i.e., in the advancement direction of the melt growth front) to provide a gradient of alloy components (e.g., a gradient of tin in germanium) across the active region 22. For example, the tin content (i.e., atomic concentration of tin) in the active region 22 of the recrystallized semiconductor layer 20 may be lower at the side 21 than at the side 23, and the tin content may increase in a direction from the side 21 to side 23.

Figure 5:
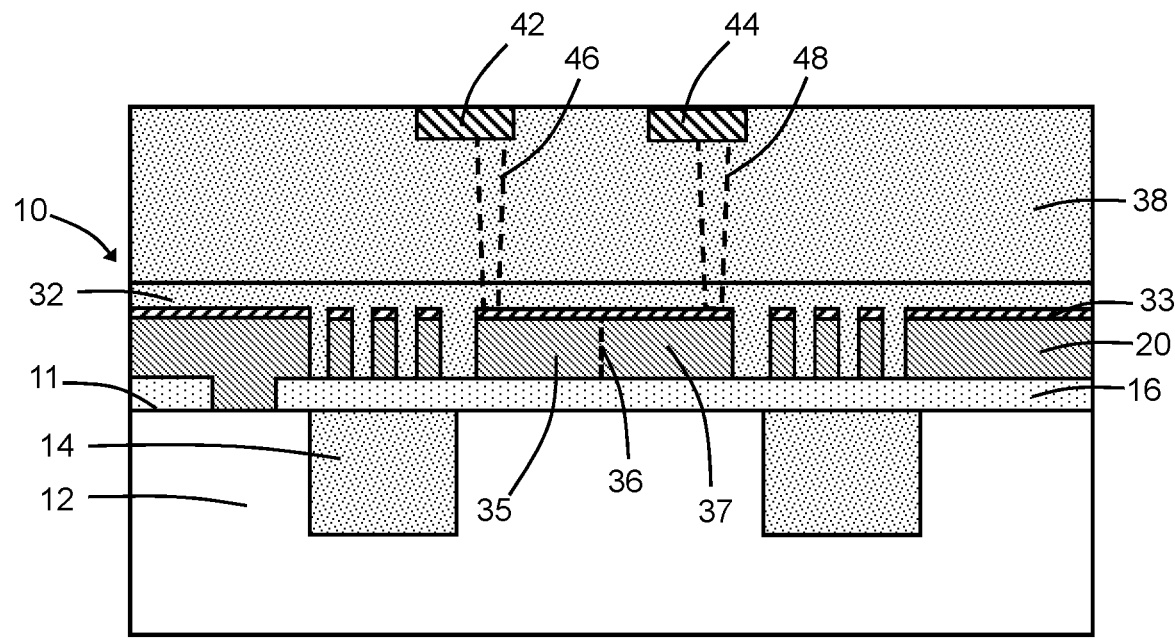
Figure 6:
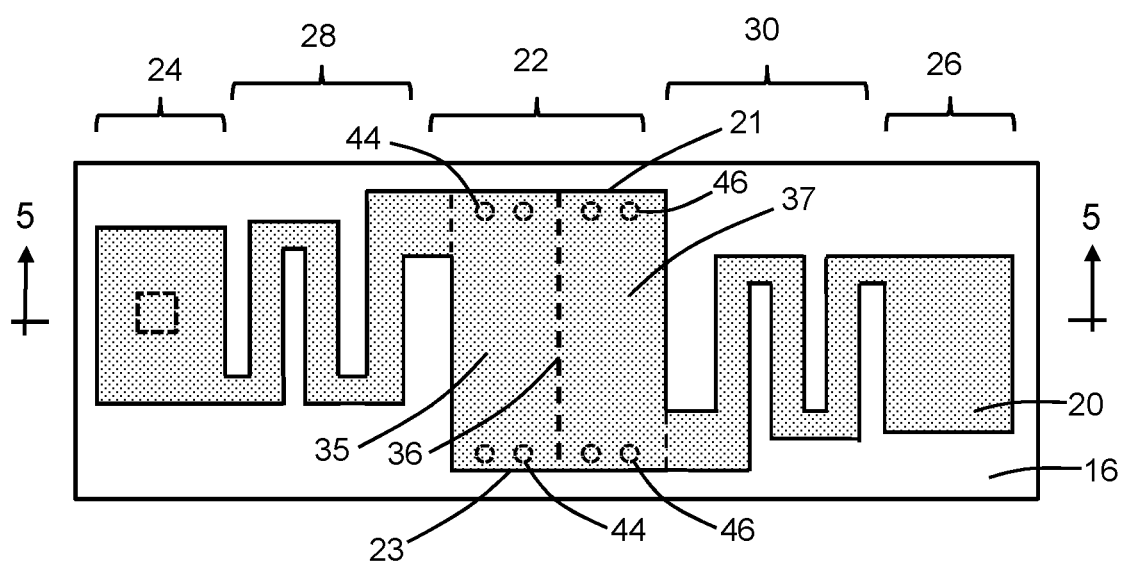

With reference to FIGS. 5, 6 in which like reference numerals refer to like features in FIG. 4 and at a subsequent fabrication stage, the dielectric layer 34 is removed, and doped regions 35, 37 having conductivity types of opposite polarity are formed in the active region 22 of the recrystallized semiconductor layer 20. The doped region 35 may be formed by introducing a dopant of one conductivity type by, for example, ion implantation into a portion of the active region 22 of the recrystallized semiconductor layer 20. The doped region 37 may be formed by introducing a dopant of the opposite conductivity type by, for example, ion implantation into an adjacent portion of active region 22 of the recrystallized semiconductor layer 20. Respective patterned implantation masks may be used to define the selected locations for the doped regions 35, 37, and are stripped after each of the doped regions 35, 37 is formed. The doped region 35 may be formed either before or after the doped region 37.

In an embodiment, the semiconductor material of the doped region 35 may comprise an n-type dopant (e.g., phosphorus or arsenic) effective to impart n-type conductivity, and the semiconductor material of doped region 37 may comprise a p-type dopant (e.g., boron) effective to impart p-type conductivity. Implantation conditions (e.g., kinetic energy and dose) are selected to form each of the doped regions 35, 37 with a desired doping profile and concentration. In an embodiment, the doped regions 35, 37 may each be constituted by moderately-doped semiconductor material formed through a selection of the respective implantation conditions. The doped regions 35, 37, which are located beneath the top surface of the recrystallized semiconductor layer 20, may each extend in a vertical direction through the full thickness of the semiconductor layer 20 to the underlying dielectric layer 16.

The active region 22 defines a photodiode or photodetector that includes the doped regions 35, 37 and that is positioned over the top surface 11 of the substrate 12. The doped regions 35, 37 converge along a p-n junction 36 at which the polarity of the conductivity type changes from p-type to n-type. The p-n junction 36 may extend laterally from the side 21 of the active region 22 to the side 23 of the active region 22 in a direction that is coincident with the direction of the rapid melt growth front. The arrangement of the doped regions 35, 35 may be effective to balance electrical sampling of the photon count gradient during operation of the photodetector.

In an embodiment in which multiple photodetectors are formed on the substrate 12, the lengths of the serpentine regions 28, 30 may differ in order to generate different alloy compositions in the respective active regions 22. For example, photodetectors may be formed with germanium-tin alloys containing different atomic concentrations of tin to define multiple pixels characterized by different absorption wavelengths.

Middle-of-line (MOL) processing and back-end-of-line (BEOL) processing follow, which includes formation of silicide, contacts, vias, and wiring for an interconnect structure coupled with the photodetector. The interconnect structure includes one or more dielectric layers 38 that are composed of an electrical insulator, such as silicon dioxide. The one or more dielectric layers 38 are patterned by lithography and etching processes to form via openings and trenches arranged above the via openings as part of a dual-damascene process. Wiring features 42, 44 are formed inside the trenches patterned in the one or more dielectric layers 38, and vias 46, 48 are respectively formed inside the via openings patterned in the one or more dielectric layers 38 to a metallization level over the photodetector. The wiring features 42, 44 and vias 46, 48 may be comprised of a metal, such as copper, aluminum, or cobalt, and additional liner and barrier layers (e.g., tantalum nitride or titanium nitride) also present. The conductor constituting the wiring features 42, 44 and vias 46, 48 may be deposited by an electrochemical deposition process, such as electroplating or electroless plating. The via 46 electrically and physically connects the wiring feature 42 with the doped region 35. The via 48 electrically and physically connects the doped region 37 with the wiring feature 44.

The portions of the melt path length provided by the serpentine regions 28, 30 conserve area on the top surface 11 of the substrate 12 as compared with straight connecting segments. The serpentine regions 28, 30 may function to getter dislocations and improve crystalline quality of the recrystallized semiconductor layer 20, particularly the crystalline quality of the recrystallized semiconductor layer 20 in the active region 22. The material of semiconductor layer 20 in the active region 22 defines a photodetector that may be fully and monolithically integrated into a CMOS or BiCMOS process. The substrate 12 may be diced to provide a single die or chip that monolithically integrates both a photodetector as an optical component and either CMOS or BiCMOS electronic components. The crystalline material of the semiconductor layer 20 in the active region 22 is formed using rapid melt growth with a composition having an alloy component (e.g., tin) that is graded in the side-to-side advancement direction of the melt growth front across the active region 22. The graded content of the alloy component (e.g., the graded atomic concentration of tin) in the active region 22 may be selectable through, among other factors, the section of the melt path length provided by the physical lengths of the serpentine region 28.

The photodetector provided by the active region 22 of the semiconductor layer 20 may absorb laser light at longer wavelengths, such as a wavelength of about 1.5 microns. This improvement to the photodetector may permit the laser of a Light Detection and Ranging (LIDAR) system to operate at a higher power exhibiting an improved signal-to-noise ratio.

Figure 7:
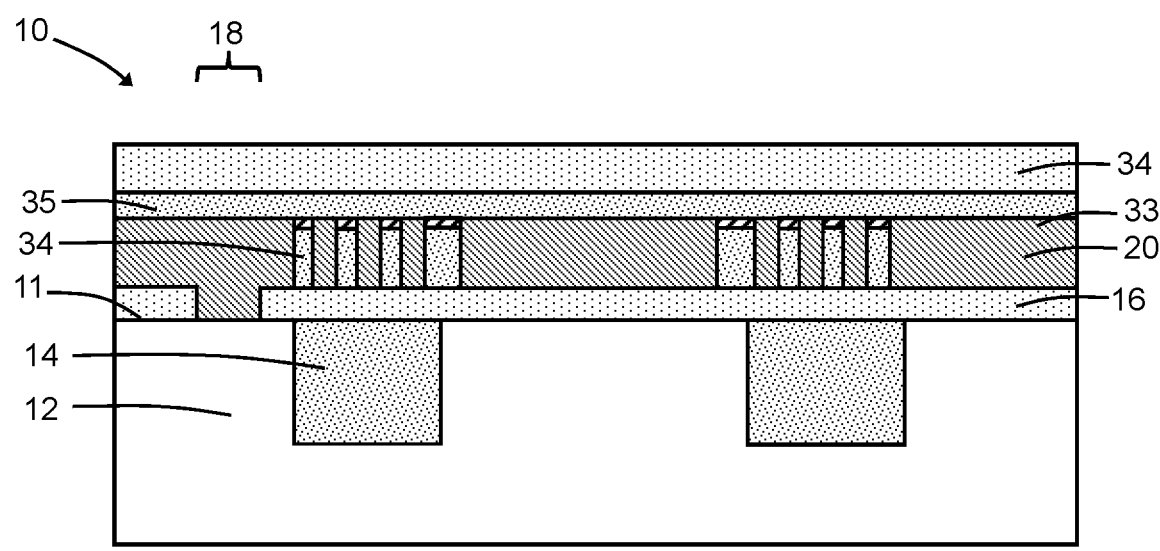
FIG. 7 is a cross-sectional view of a structure in accordance with alternative embodiments of the invention.

With reference to FIG. 7 in which like reference numerals refer to like features in FIG. 4 and in accordance with alternative embodiments, the hardmask 33 may be formed over the dielectric layer 32 and the dielectric layer 32 may be patterned by an etching process with the hardmask 33 present. The patterning of the dielectric layer 32 defines a trench shaped to correlate with the different regions 22, 24, 26, 28, 30 of the semiconductor layer 20. The semiconductor layer 20 is epitaxially grown or deposited, and then planarized with the hardmask 33 functioning as a polish stop during planarization. The trench provides a template in the dielectric layer 32 for defining the regions 22, 24, 26, 28, 30 of the semiconductor layer 20. Another dielectric layer 35 of identical or similar composition to the dielectric layer 32 may be blanket deposited after planarization and before depositing the dielectric layer 34. Processing continues as described in connection with FIGS. 5, 6 and, in the completed structure 10, the sections of the hardmask 33 are positioned over the sections of the dielectric layer 32 surrounding the trench used as a template to form the regions 22, 24, 26, 28, 30 of the semiconductor layer 20.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate including a top surface; and
a photodetector positioned over the top surface of the substrate, the photodetector including a first portion of a semiconductor layer comprised of a semiconductor alloy, a p-type doped region in the first portion of the semiconductor layer, and an n-type doped region in the first portion of the semiconductor layer, the first portion of the semiconductor layer having a first side and a second side opposite from the first side, and the semiconductor alloy having a composition that is laterally graded from the first side to the second side,
wherein the semiconductor layer includes a second portion that is directly connected to the first side of the first portion of the semiconductor layer, and the second portion of the semiconductor layer has a first serpentine layout.

2. The structure of claim 1 wherein the semiconductor layer includes a third portion that is directly connected to the second side of the first portion of the semiconductor layer, and the third portion of the semiconductor layer has a second serpentine layout.

3. The structure of claim 1 wherein the first side of the first portion of the semiconductor layer is coupled by the second portion of the semiconductor layer to a portion of the substrate providing a seed region.

4. The structure of claim 3 wherein the semiconductor alloy is a germanium-tin alloy, and the germanium-tin alloy has a tin content that is lower at the first side of the first portion of the semiconductor layer than at the second side of the first portion of the semiconductor layer.

5. The structure of claim 3 wherein the semiconductor alloy is a germanium-tin alloy, and the germanium-tin alloy has a tin content that increases in a direction from the first side of the first portion of the semiconductor layer to the second side of the first portion of the semiconductor layer.

6. The structure of claim 1 further comprising:
a dielectric layer positioned between the first portion of the semiconductor layer and the substrate.

7. The structure of claim 1 wherein the semiconductor layer is directly coupled to a portion of the substrate providing a seed region.

8. The structure of claim 7 further comprising:
a dielectric layer positioned between the semiconductor layer and the substrate, the dielectric layer including an opening extending though the dielectric layer to the portion of the substrate, and the semiconductor layer is directly coupled to the seed region through the opening.

9. The structure of claim 1 wherein the semiconductor alloy is a germanium-tin alloy, and the germanium-tin alloy has a tin content that is lower at the first side of the first portion of the substrate than at the second side of the first portion of the substrate.

10. The structure of claim 1 wherein the semiconductor alloy is a germanium-tin alloy, and the germanium-tin alloy has a tin content that increases in a direction from the first side of the first portion of the semiconductor layer to the second side of the first portion of the semiconductor layer.

11. The structure of claim 1 wherein the semiconductor alloy is a germanium-tin alloy.

12. A method comprising:
forming a semiconductor layer over a substrate;
forming a p-type doped region in a first portion of the semiconductor layer; and
forming an n-type doped region in the first portion of the semiconductor layer,
wherein the first portion of the semiconductor layer is comprised of a semiconductor alloy, the first portion of the semiconductor layer has a first side and a second side opposite from the first side, the semiconductor alloy has a composition that is laterally graded from the first side to the second side, the semiconductor layer includes a second portion that is directly connected to the first side of the first portion of the semiconductor layer, and the second portion of the semiconductor layer has a first serpentine layout.

13. The method of claim 12 wherein the semiconductor layer includes a third portion of the semiconductor layer that is directly connected to the second side of the first portion of the semiconductor layer, and the third portion of the semiconductor layer has a second serpentine layout.

14. The method of claim 12 wherein the first side of the first portion of the semiconductor layer is coupled by the second portion of the semiconductor layer to a portion of the substrate providing a seed region.

15. The method of claim 12 wherein the semiconductor alloy is a germanium-tin alloy, and the germanium-tin alloy has a tin content that increases in a direction from the first side of the first portion of the semiconductor layer to the second side of the first portion of the semiconductor layer.

16. The method of claim 12 wherein the semiconductor alloy is a germanium-tin alloy, and the germanium-tin alloy has a tin content that is lower at the first side of the first portion of the substrate than at the second side of the first portion of the substrate.

17. The structure of claim 1 wherein the p-type doped region and the n-type doped region converge along a p-n junction.

18. The method of claim 12 wherein the p-type doped region and the n-type doped region converge along a p-n junction.

19. The structure of claim 17 wherein the p-n junction extends laterally in the first portion of the semiconductor layer from the first side of the first portion of the semiconductor layer to the second side of the first portion of the semiconductor layer.

20. The structure of claim 19 further comprising:
   an interconnect structure over the photodetector, the interconnect structure including a first via extending to the p-type doped region and a second via extending to the n-type doped region.

* * * * *